US006631502B2

United States Patent
Buffet et al.

(10) Patent No.: US 6,631,502 B2
(45) Date of Patent: Oct. 7, 2003

(54) METHOD OF ANALYZING INTEGRATED CIRCUIT POWER DISTRIBUTION IN CHIPS CONTAINING VOLTAGE ISLANDS

(75) Inventors: Patrick H. Buffet, Essex Junction, VT (US); Joseph N. Kozhaya, Essex Junction, VT (US); Paul D. Montane, Essex, VT (US); Robert A. Proctor, So. Burlington, VT (US); Erich C. Schanzenbach, Dover Plains, NY (US); Ivan L. Wemple, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,545

(22) Filed: Jan. 16, 2002

(65) Prior Publication Data
US 2003/0135830 A1 Jul. 17, 2003

(51) Int. Cl.[7] .............................................. G06F 17/50
(52) U.S. Cl. .............................................. 716/4; 716/1
(58) Field of Search ....................................... 716/1–14

(56) References Cited

U.S. PATENT DOCUMENTS

| | | | | |
|---|---|---|---|---|
| 4,451,743 A | * | 5/1984 | Suzuki et al. ............... | 307/110 |
| 5,672,997 A | * | 9/1997 | Shield ......................... | 327/538 |
| 6,181,027 B1 | * | 1/2001 | Grady ......................... | 307/31 |
| 6,493,859 B1 | * | 12/2002 | Gould et al. .................. | 716/12 |
| 2002/0038732 A1 | * | 4/2002 | Sugiura et al. ............ | 180/65.2 |
| 2002/0149263 A1 | * | 10/2002 | Blanco et al. ................ | 307/64 |

OTHER PUBLICATIONS

MAXIM, New Release Data Book (1995), vol. IV, Maxim Integrated Products, Inc. pp 4–47 to 4–56.*

* cited by examiner

Primary Examiner—Vuthe Siek
Assistant Examiner—Sun James Lin
(74) Attorney, Agent, or Firm—Schmeiser, Olsen & Watts; Richard M. Kotulak

(57) ABSTRACT

A method of analyzing the power distribution in a chip containing one or more voltage islands, each voltage island having a power distribution network connected to a chip-level power distribution network by one or more voltage translation interface circuits. The method comprising: analyzing the voltage-island power distribution networks independently of the chip-level power distribution network to obtain voltage translation interface circuit currents; using the voltage translation interface circuit currents as input to a model of the chip-level power distribution network to obtain voltage translation interface circuit input voltages; and calculating voltage translation interface circuit output voltages based on the voltage translation interface circuit input voltages, the voltage translation interface circuit currents, and current-voltage characteristics of the voltage translation interface circuits.

16 Claims, 10 Drawing Sheets

METHOD OF ANALYZING INTEGRATED CIRCUIT POWER DISTRIBUTION IN CHIPS CONTAINING VOLTAGE ISLANDS

BACKGROUND OF THE INVENTION

1. Field of the Invention

The present invention relates to the field of integrated circuits; more specifically, it relates to the design and verification of power distribution networks in integrated circuit chips containing voltage islands.

2. Background of the Invention

Integrated circuit (IC) chip design and manufacturing techniques have progressed to the point where advanced levels of system-on-chip (SOC) integration complexity create serious problems related to the distribution of power to the integrated circuit. Such problems are associated with battery life, and the thermal and electrical integrity and robustness of on-chip interconnect.

A broad set of techniques for reducing the power required by IC chips includes partitioning the individual circuits into functional blocks that may be selectively powered up or down or even powered at voltage levels that are different from chip-level voltages. Circuits that may be periodically powered down, or run at different voltage levels, or at voltage levels derived from separate sources, are isolated from the primary power distribution network of the IC chip by placing them in "voltage islands." The power distribution network of each voltage island derives power from the primary, chip-level power distribution network using voltage translation interface (VTI) circuits. Included in the class of VTI circuits are series-connected VDDx switches (i.e., headers), series-connected GNDx switches (i.e., footers), level shifters, voltage regulators, DC-to-DC converters, and even direct electrical connections (i.e., wires).

An IC power distribution network may comprise one or more of chip-level networks, each powered by arbitrary voltage level pairs, for example, VDD1 and GND1, VDD2 and GND2, etc. Moreover, a single supply voltage level may be shared among a multiplicity of chip-level networks, for example, VDD1 and GND, VDD2 and GND, etc.

Power distribution analysis for detecting power "hot spots" and other potential reliability problems in IC chip design is critical to the success of any integrated design and manufacturing operation.

Traditional methods of power distribution analysis use circuit simulation and linear network models of the chip power distribution to determine the currents and voltages associated with power grid wires and network nodes, respectively.

In the linear model, each network node represents the intersection of power grid wires on adjacent metallization levels, the location of a power source (e.g., C4 or wirebond pad), or the location of an active device or circuit. Of particular interest for voltage analysis are the subset of network nodes called "ports," which represent the modeled locations where active circuits are connected to the power distribution network.

Traditional analysis methods treat IC power distribution systems as passive resistive-inductive-capacitive (RLC) networks and determine current and voltage values by circuit simulation, where current sources are used to model the switching behavior of the active circuits. Moreover, since typical power distribution models contain millions of nodes, the relative efficiency of "linear" circuit simulation has made it essential for this type of analysis.

Further, traditional methods cannot be directly applied to IC chips containing voltage islands for at least two reasons. First, VTI circuits, in general, disrupt the electrical continuity of the power distribution system and its modeled RLC network equivalent. Second, the VTI circuits are generally characterized by nonlinear current-voltage relationships and thus difficult, or impossible, to efficiently model for linear circuit simulation.

Therefore, a need exists for an efficient method of analyzing power distributions in IC chips containing voltage islands.

SUMMARY OF THE INVENTION

A first aspect of the present invention is a method of analyzing the power distribution in a chip containing one or more voltage islands, each voltage island having a power distribution network connected to a chip-level power distribution network by one or more voltage translation interface circuits comprising: analyzing the voltage-island power distribution networks independently of the chip-level power distribution network to obtain voltage translation interface circuit currents; using the voltage translation interface circuit currents as input to a model of the chip-level power distribution network to obtain voltage translation interface circuit input voltages; and calculating voltage translation interface circuit output voltages based on the voltage translation interface circuit input voltages, the voltage translation interface circuit currents, and current-voltage characteristics of the voltage translation interface circuits.

A second aspect of the present invention is method of analyzing power distribution in a chip containing one or more voltage islands, each voltage island having a power distribution network is connected to a chip-level power distribution network by one or more voltage translation interface circuits comprising: (a) creating a chip-level power distribution network model connected to chip-level placed circuits modeled as current sources; (b) independently creating a voltage-island power distribution network model connected between voltage translation interface circuit outputs and voltage-island placed circuits modeled as current sources; (c) obtaining voltage translation interface circuit currents by: (i) in a first iteration, using the ideal value of an external voltage source voltage as the values of the voltage translation interface circuit output voltages; (ii) in subsequent iterations using the most recently computed values for the voltage translation interface circuit output voltages; and (iii) simulating the voltage-island power distribution network model with its corresponding voltage-island placed circuits modeled as current sources and the most recently obtained values for its voltage translation interface circuit output voltages applied as voltage sources; (d) exciting the chip-level power distribution network model with the most recently obtained values of the voltage translation interface circuit currents; (e) obtaining, through simulation of the chip-level power distribution network model, values for the voltage translation interface circuit input voltages and values for the chip-level placed circuit port voltages; (f) calculating updated values for the voltage translation interface circuit output voltages, based on the most recently obtained values for the voltage translation interface circuit input voltages, the currents through the voltage translation interface circuits, and the current-voltage characteristics of the voltage translation interface circuits; and (g) comparing the updated values to immediately previous values for the chip-level placed circuit port voltages, voltage translation interface circuit input voltages, and voltage translation circuit output voltages, and, if not converged to within a preset limit, repeating steps (c) through (g).

A third aspect of the present invention is a program storage device readable by machine, tangibly embodying a program of instructions executable by the machine to perform method steps for analyzing power distribution in a chip containing one or more voltage islands, each voltage island having a power distribution network is connected to a chip-level power distribution network by one or more voltage translation interface circuits, the method steps comprising: (a) creating a chip-level power distribution network model connected to chip-level placed circuits modeled as current sources; (b) independently creating a voltage-island power distribution network model connected between voltage translation interface circuit outputs and voltage-island placed circuits modeled as current sources; (c) obtaining voltage translation interface circuit currents by: (i) in a first iteration, using the ideal value of an external voltage source voltage as the values of the voltage translation interface circuit output voltages; (ii) in subsequent iterations using the most recently computed values for the voltage translation interface circuit output voltages; and (iii) simulating the voltage-island power distribution network model with its corresponding voltage-island placed circuits modeled as current sources and the most recently obtained values for its voltage translation interface circuit output voltages applied as voltage sources; (d) exciting the chip-level power distribution network model with the most recently obtained values of the voltage translation interface circuit currents; (e) obtaining, through simulation of the chip-level power distribution network model, values for the voltage translation interface circuit input voltages and values for the chip-level placed circuit port voltages; (f) calculating updated values for the voltage translation interface circuit output voltages, based on the most recently obtained values for the voltage translation interface circuit input voltages, the currents through the voltage translation interface circuits, and the current-voltage characteristics of the voltage translation interface circuits; and (g) comparing the updated values to immediately previous values for the chip-level placed circuit port voltages, voltage translation interface circuit input voltages, and voltage translation circuit output voltages, and, if not converged to within a preset limit, repeating steps (c) through (g).

A fourth aspect of the present invention is a computer system comprising a processor, an address/data bus coupled to the processor, and a computer-readable memory unit coupled to communicate with the processor, the memory unit containing instructions that when executed implement a method for analyzing power distribution in a chip containing one or more voltage islands, each voltage island having a power distribution network connected to a chip-level power distribution network by one or more voltage translation interface circuits, the method comprising the computer implemented steps of: (a) creating a chip-level power distribution network model connected to chip-level placed circuits modeled as current sources; (b) independently creating a voltage-island power distribution network model connected between voltage translation interface circuit outputs and voltage-island placed circuits modeled as current sources; (c) obtaining voltage translation interface circuit currents by: (i) in a first iteration, using the ideal value of an external voltage source voltage as the values of the voltage translation interface circuit output voltages; (ii) in subsequent iterations using the most recently computed values for the voltage translation interface circuit output voltages; and (iii) simulating the voltage-island power distribution network model with its corresponding voltage-island placed circuits modeled as current sources and the most recently obtained values for its voltage translation interface circuit output voltages applied as voltage sources; (d) exciting the chip-level power distribution network model with the most recently obtained values of the voltage translation interface circuit currents; (e) obtaining, through simulation of the chip-level power distribution network model, values for the voltage translation interface circuit input voltages and values for the chip-level placed circuit port voltages; (f) calculating updated values for the voltage translation interface circuit output voltages, based on the most recently obtained values for the voltage translation interface circuit input voltages, the currents through the voltage translation interface circuits, and the current-voltage characteristics of the voltage translation interface circuits; and (g) comparing the updated values to immediately previous values for the chip-level placed circuit port voltages, voltage translation interface circuit input voltages, and voltage translation circuit output voltages, and, if not converged to within a preset limit, repeating steps (c) through (g).

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
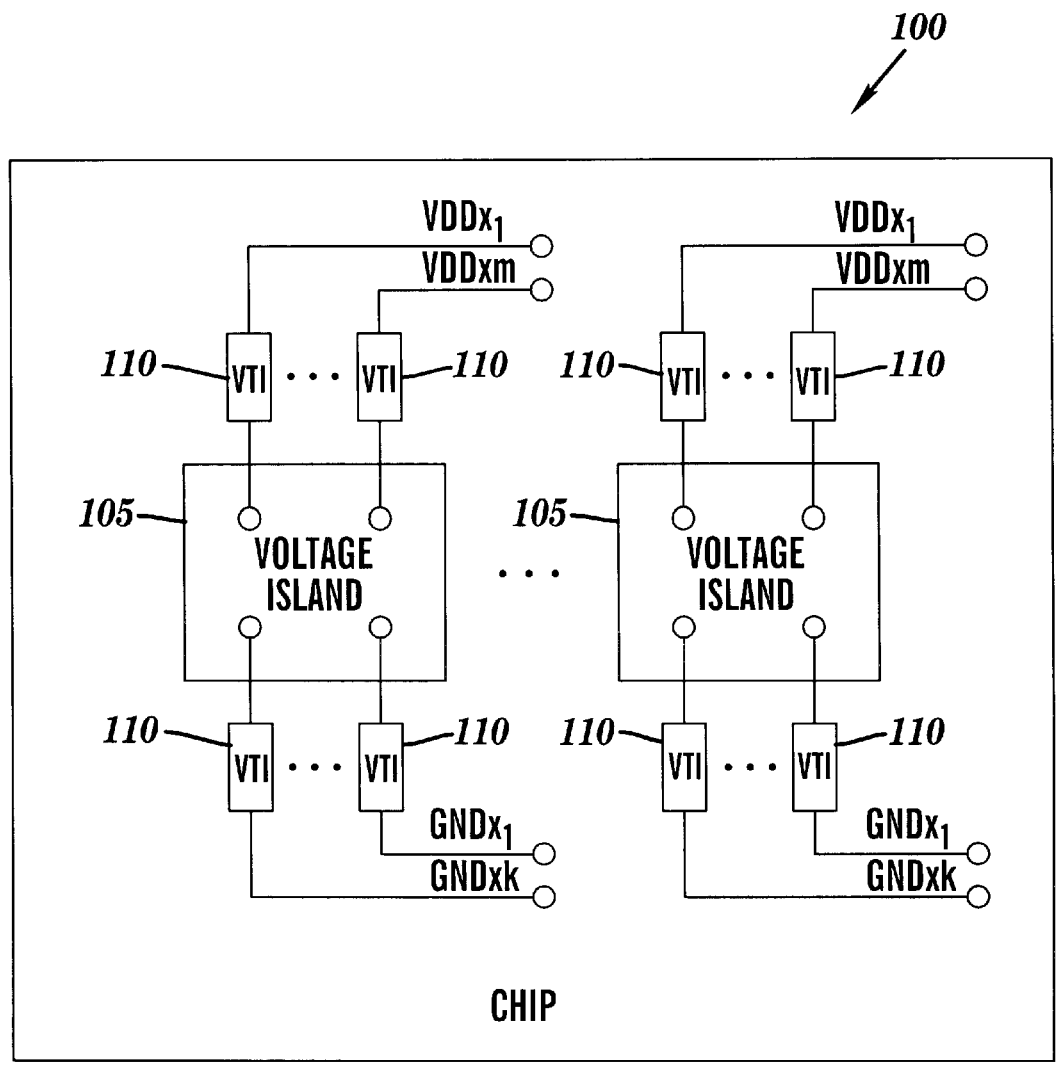
FIG. 1 is a diagram illustrating an integrated circuit chip containing voltage islands, according to the present invention.

FIG. 1 is a diagram illustrating an integrated circuit chip containing voltage islands according to the present invention. In FIG. 1, integrated circuit chip 100 includes one or more voltage island(s) 105. Each voltage island 105 is connected to the chip-level power distribution through one or more voltage translation interface (VTI) circuits 110.

VDDx is defined as any externally-supplied chip-level power supply voltage whose relative level is more positive than its corresponding GNDx chip-level supply. Similarly, GNDx is defined any externally-applied, chip-level power supply voltage whose relative level is more negative than its corresponding VDDx chip-level supply.

In practice, spatial variations in the wiring topology, circuit density, and circuit power demands induce variations in the localized voltage levels of the power distribution system. VTI circuit 110 port voltages are denoted $VDDx_1-VDDx_m$ and $GNDx_1-GNDx_k$, where m is the number of voltage-island VDDx ports and k is the number of voltage-island GNDx ports. Although voltage islands 105 illustrated in FIG. 1 are denoted identically for VDD and GND, different voltage islands may have different quantities of both VDDx and GNDx ports. It should be understood that VDDx may represent one of several external, chip-level VDD supplies, and GNDx may represent one of several external, chip-level GND supplies (x=1, 2, . . . ). In general, each VDDx and each GNDx supply can support multiple voltage islands 105 and any VDDx/GNDx combination can be arbitrarily assigned to any voltage island. In one common configuration, the chip power distribution contains several voltage islands 105 in each of several VDDx (x=1, 2, . . . ) "domains", and all of the circuits share a common GND power network.

Figure 2:
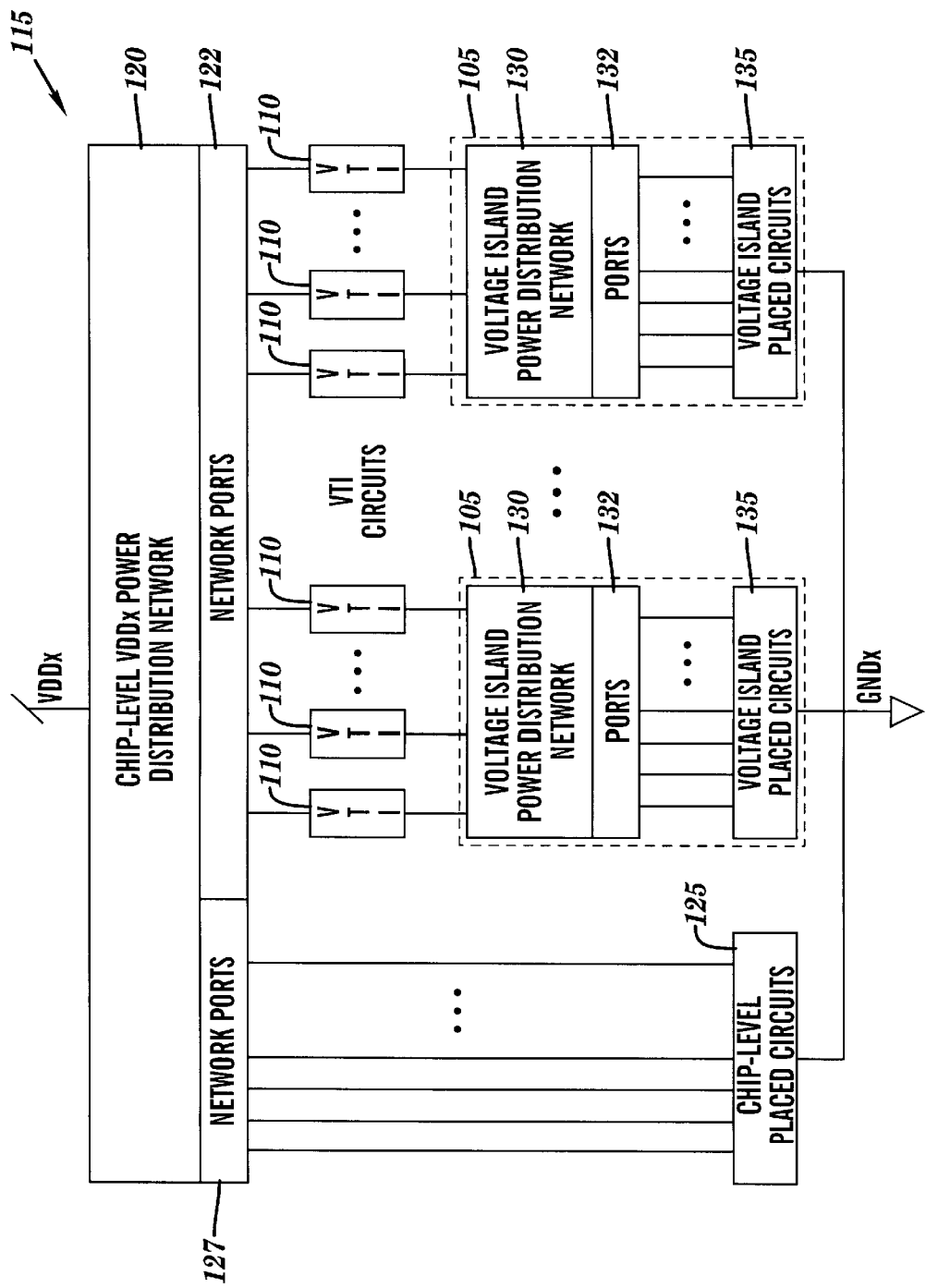
FIG. 2 is a schematic diagram of the VDD portion of a power distribution network of integrated circuit chip 100 of FIG. 1, according to the present invention.

FIG. 2 is a schematic diagram of the VDDx portion of a power distribution network of integrated circuit chip, 100 of FIG. 1, according to the present invention. In FIG. 2, the GNDx portion of the network is modeled as a single, ideal voltage source. A power distribution network 115 includes a chip-level power distribution network 120, connected at a first subset of network ports 127 to chip-level VDDx and GNDx placed circuits 125. Chip-level placed circuits 125 represent switching activity that is external to any voltage island, and excites the chip-level power distribution directly.

Chip-level power distribution network 120 is also connected, at a second subset network ports 122, through VTI circuits 110, to one or more voltage-island power distribution networks 130. Power distribution networks 130 are connected at voltage-island circuit ports 132 to voltage-island placed circuits 135. Note that any voltage-island power distribution network 130 and its constituent voltage-island placed circuits 135 are internal to its associated voltage island 105.

In the present example, chip-level VDDx power distribution network 120 is modeled as a passive, linear RLC network. The present invention also models the voltage-island power distribution networks 130 as linear circuits. However, VTI circuits 110, may represent circuits or devices with nonlinear current-voltage (I-V) characteristics.

Figure 3:
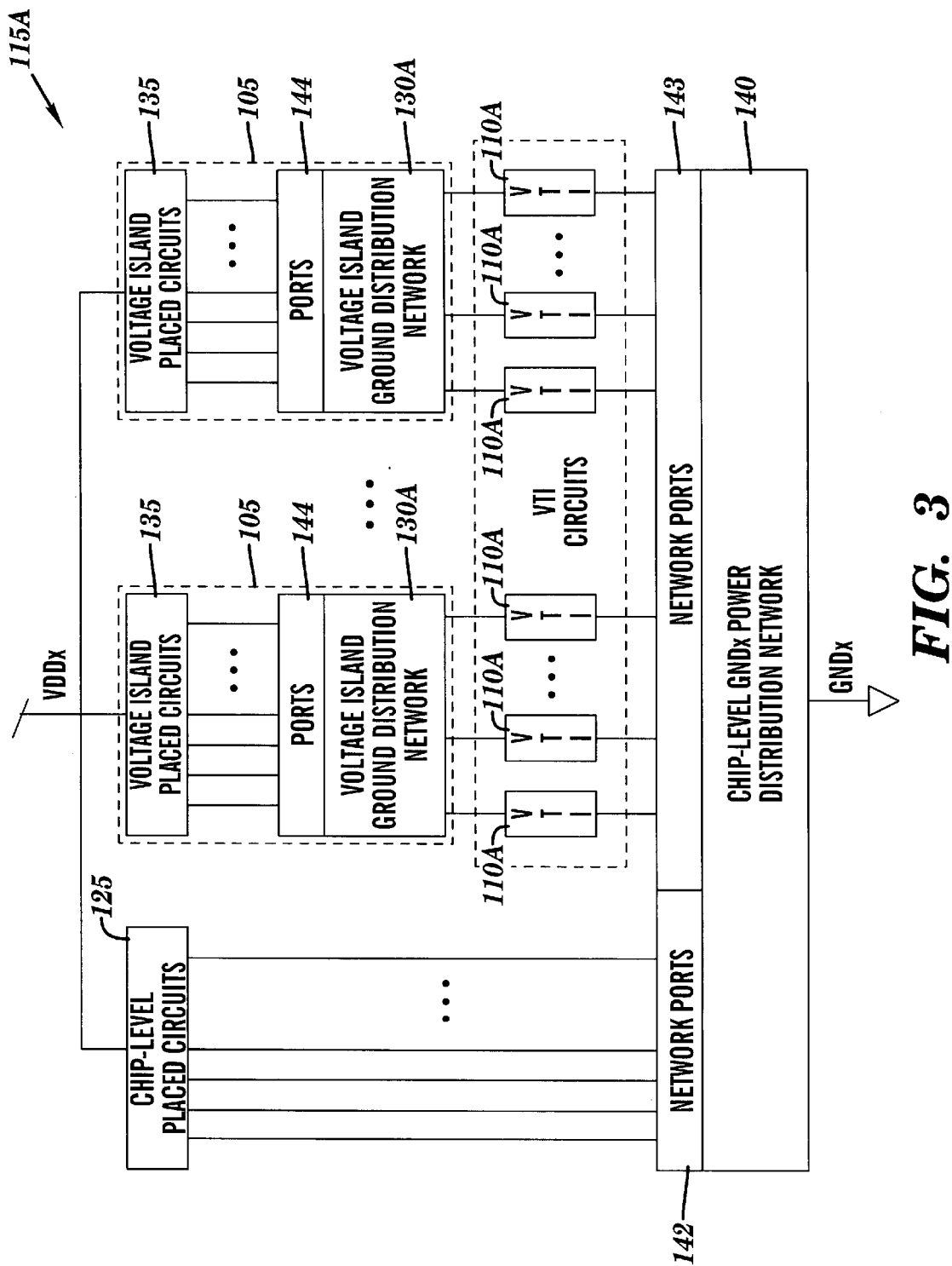
FIG. 3 is a schematic diagram of the GNDx portion of the power distribution network of integrated circuit chip 100 of FIG. 1, according to the present invention.

FIG. 3 is a schematic diagram of the GNDx portion of the power distribution network of integrated circuit chip 100 of FIG. 1, according to the present invention. In FIG. 3, the VDDx portion of the network is modeled as a single, ideal voltage source. Ground distribution network 115A includes a chip-level ground distribution network 140, connected at a first subset of network ports 142 to chip-level VDDx and GNDx placed circuits 125. Chip-level ground distribution network 140 is also connected, at a second subset of network ports 143, through GNDx VTI circuits 110A, to one or more voltage-island ground distribution networks 130A. Voltage-island ground distribution networks 130A are connected at voltage island circuit ports 144 to voltage-island placed circuits 135. In the present example, the chip-level ground distribution network 140 and the voltage-island ground distribution networks 130A are modeled as passive, linear RLC networks. The GNDx VTI circuits 110A, may represent circuits or devices with linear current-voltage (I-V) characteristics.

Figure 4:
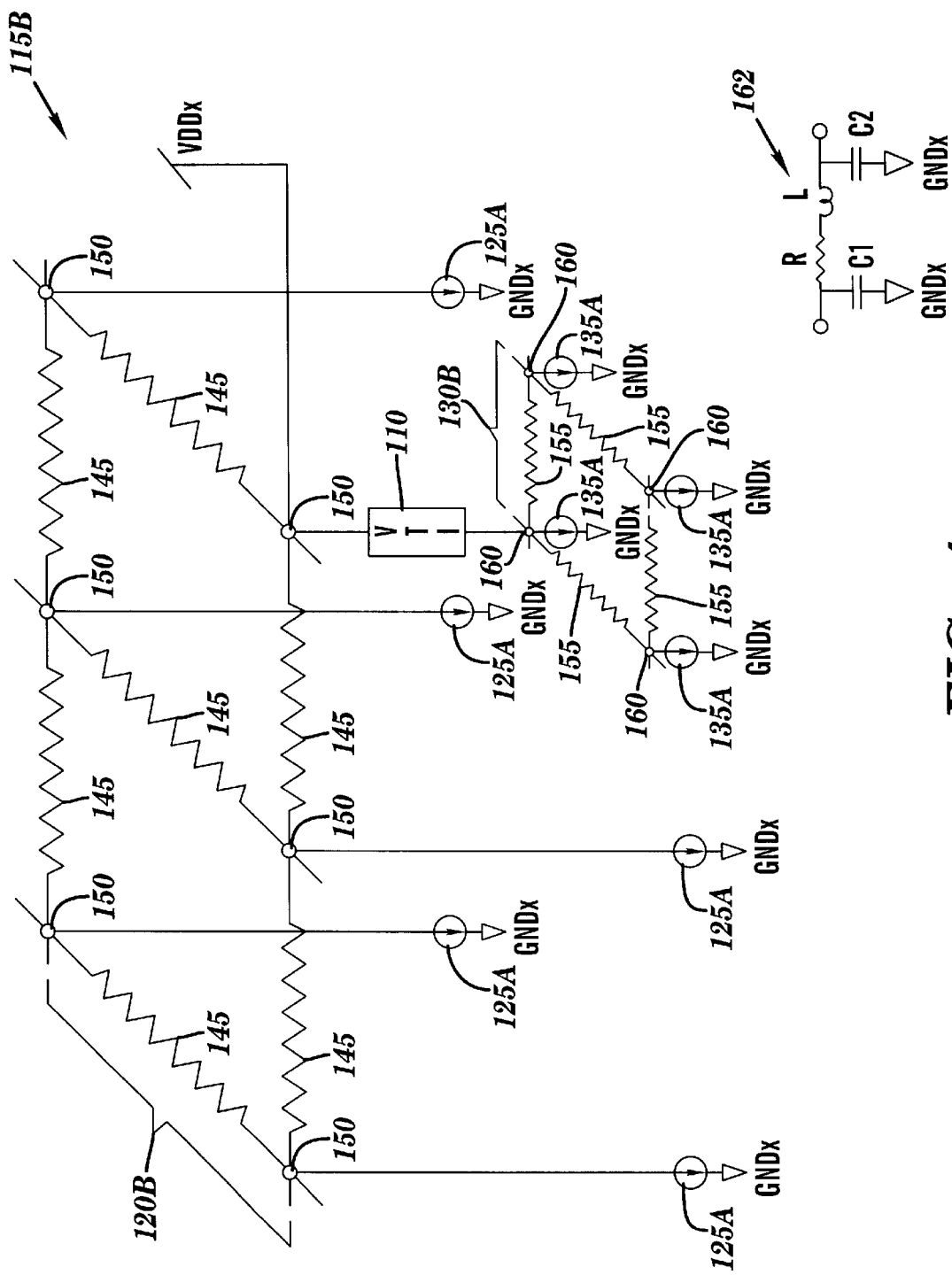
FIG. 4 is a schematic diagram illustrating a portion of the VDDx power distribution network, 115 of FIG. 2, modeled as a resistive network, according to the present invention.

FIG. 4 is a schematic diagram illustrating a portion of the power distribution network 115 of FIG. 2 modeled as a resistive network, according to the present invention. Also shown is one (of possibly several) VDDx VTI circuits, and current sources which represent the switching activity of both chip-level and voltage-island placed circuits. IN FIG. 4, power distribution network model 115B includes a chip-level power distribution network 120B, and a voltage-island power distribution network 130B. In the present example, the wires in the chip-level power distribution network 120B are modeled as resistors 145 connected between network nodes 150. Wires in voltage-island power distribution network 130B are modeled as resistors 155 connected between network nodes 160. For transient simulation, chip-level power distribution network 120B and voltage-island power distribution network 130B may be modeled with reactive circuit elements, for example, using RC or RLC systems to represent the associated interconnect wires. In one approach to modeling the chip-level and voltage-island power distribution networks as RLC circuits, each resistor 145 and 155 is replaced with an RLC network 162 including, in this example, a resistor and linear inductor in series, and two linear capacitors which couple each network node 150 and 160 to the GNDx supply. It should be understood that the method does not constrain any passive, linear power distribution modeling to the circuit configuration or topology discussed here, and that any appropriate modifications which might be made to the network representation do not constitute a departure from the scope of the invention.

Referring again to FIG. 4, the power-supply current requirements of the chip-level placed circuits are represented as chip-level current sources 125A connected between nodes 150 and the GNDx terminal. Voltage-island placed circuits are represented as voltage-island current sources 135A connected between nodes 160 and the GNDx terminal. Finally, VDDx power (i.e., current) is delivered to the voltage-island power distribution network model 130B via VDDx VTI circuits 110 connected between nodes 150 and 160. For clarity, only one VTI circuit 110 is shown to be connected between one pair of network nodes 150 and 160, however, more than one network node 150, VTI circuit 110, and network node 160 combination may exist in practice.

FIG. 4 illustrates a network model capable of representing the electrical behavior of the VDDx power distribution network shown in FIG. 2. While not shown here, the invention employs suitable and analogous network representations for each GNDx "ground" distribution system, using elements of FIG. 3 and appropriate circuit models for the chip-level and voltage-island placed circuits, 125 and 135, respectively, chip-level ground distribution network 140, voltage-island ground distribution network 130A, and GNDx VTI circuits 110A.

The method for simulating the electrical behavior of full-chip power distributions is an iterative method. Each voltage-island power distribution is first analyzed independently on an island-by-island basis. Subsequently, the voltage-island results are combined with the chip-level power distribution analysis. Taking care to correctly "update" the network input stimuli with the most recently computed values, and then repeating the analysis procedures, the process is iterated until converging branch current and node voltage values are obtained for the entire power distribution network 115. The method for simulating the electrical behavior of full-chip power distributions is illustrated in FIG. 9 and described below.

Figure 5A:
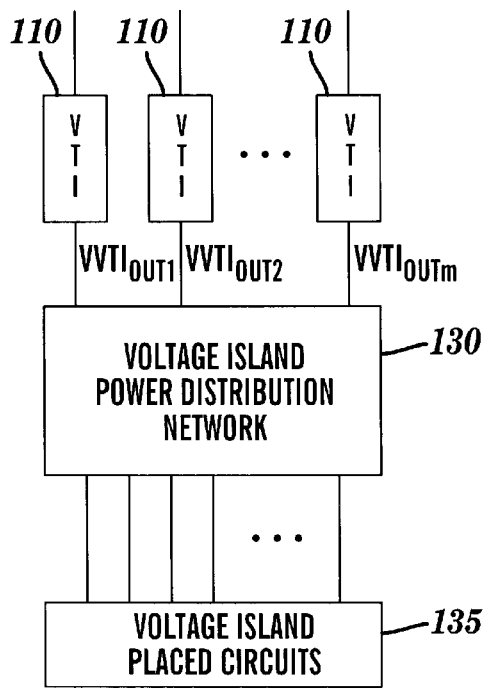
FIG. 5A is a representative voltage-island portion of the power distribution network, 115 of FIG. 2, according to the present invention.

FIG. 5A is a representative voltage-island portion of the power distribution network, 115 of FIG. 2, according to the present invention. In FIG. 5A, voltage-island power distribution network 130 delivers power from VTI circuits 110 to voltage-island placed circuits 135.

Figure 5B:
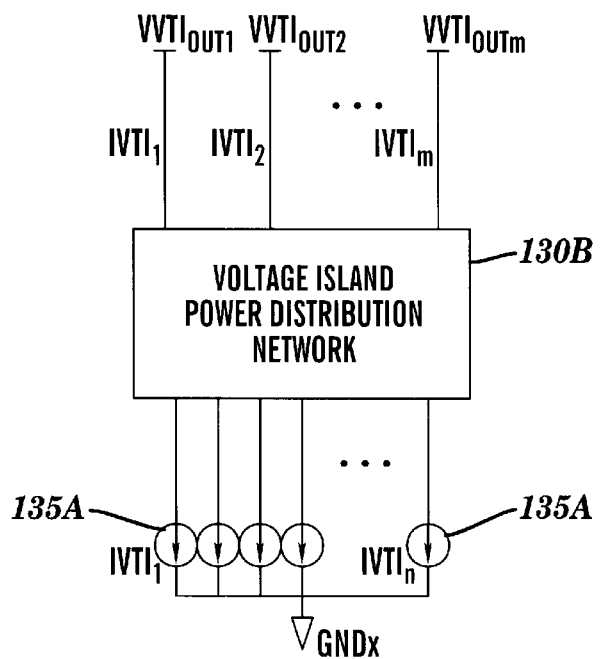
FIG. 5B is a representative model for calculating VTI current requirements, according to the present invention.

FIG. 5B is a representative model for calculating VTI current requirements, according to the present invention. In FIG. 5B, voltage-island power distribution network 130B is connected between the outputs of VTI circuits 110 of FIG. 5A and voltage-island current sources 135A, which represent voltage-island placed circuits 135 of FIG. 5A. Using (a) the linear voltage-island power distribution network 130B, (b) the voltage values, $VVTI_{OUT1}$ through $VVTI_{OUTm}$, which represent the voltages at the output terminals of the VTI circuits 110 of FIG. 5A, and (c) the modeled current sources, $IVI_1$ through $IVI_n$, which represent the voltage-island placed circuit switching activity (associated with voltage-island placed circuits 135 of FIG. 5A), the VTI circuit output currents, $IVTI_1$ through $IVTI_m$, can be obtained using conventional linear circuit analysis techniques. For the first iteration of the present method, where the voltage drops across the chip-level power network and VTI circuits are unknown, the voltage values, $VVTI_{OUT1}$ through $VVTI_{OUTm}$, are set to a constant value of $VDDx_{IDEAL}$. $VDDx_{IDEAL}$ is the voltage level of the externally-applied VDDx power supply. This analysis procedure for computing the VTI circuit output currents is repeated for each voltage island.

Figure 6A:
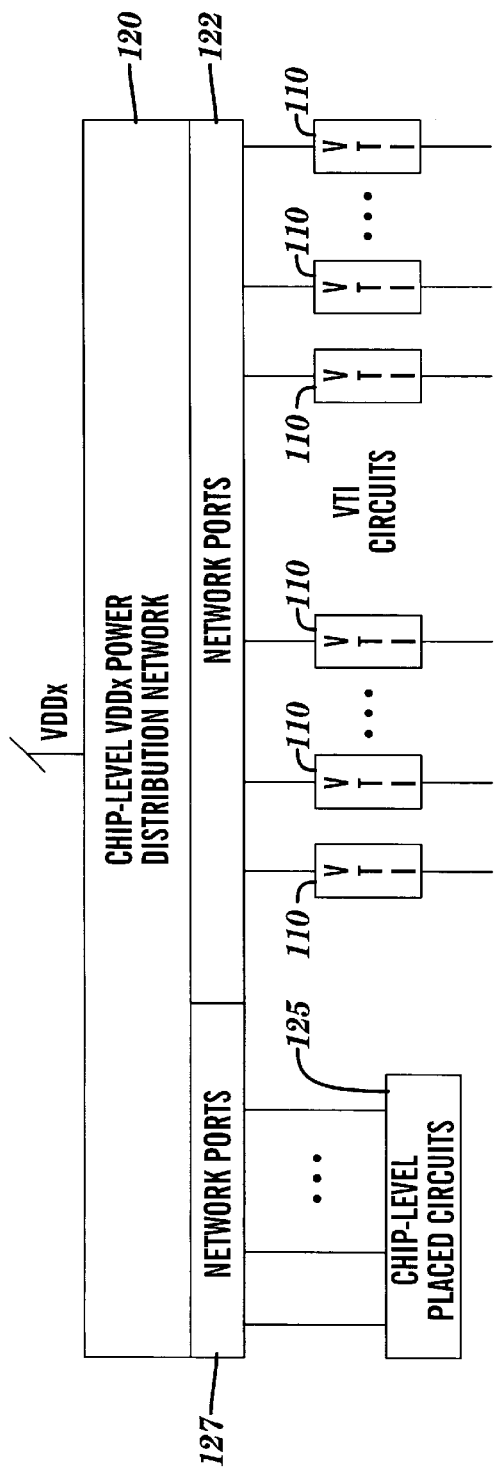
FIG. 6A is the chip-level portion of power distribution network, 120 of FIG. 2, chip-level placed circuits 125, and VTI circuits 110, according to the present invention.

FIG. 6A is the chip-level portion of power distribution network, 120 of FIG. 2, chip-level placed circuits 125, and VTI circuits 110, according to the present invention. In FIG. 6A, chip-level power distribution network 120 is connected to VTI circuits 110 and chip-level placed circuits 125 in order to supply VDDx power to the VTI circuits and the chip-level placed circuits.

Figure 6B:
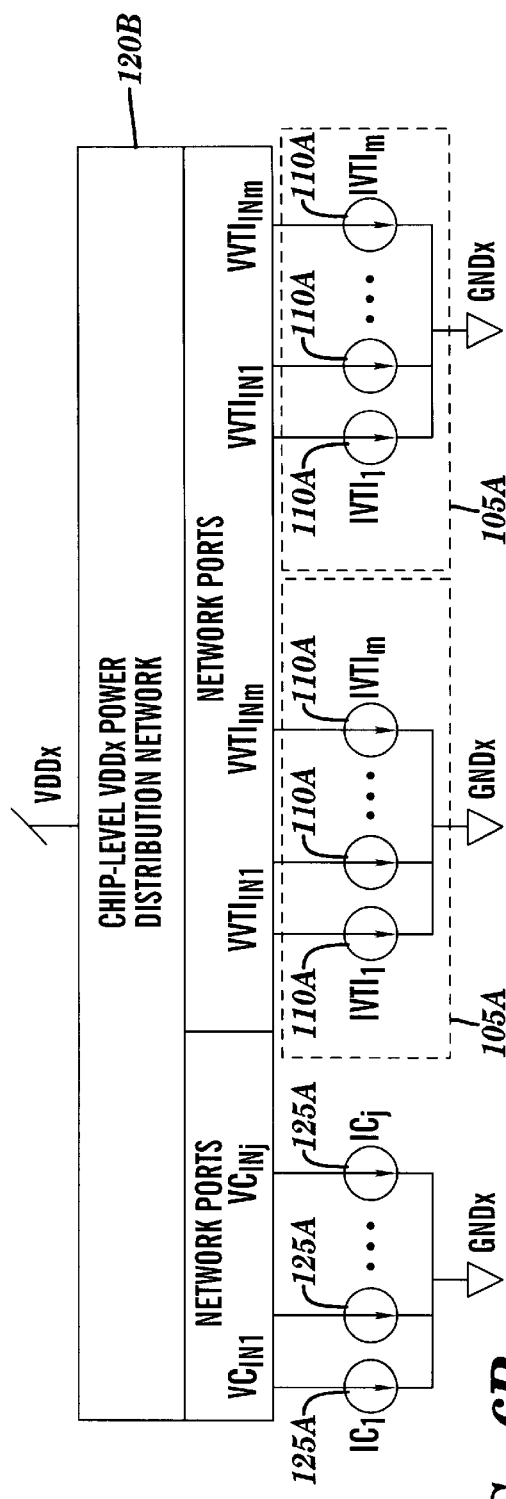
FIG. 6B is a representative model for calculating port voltages of chip-level placed circuits 125 and input voltages of VTI circuits 110 from chip-level power distribution network 120 of FIG. 6A.

FIG. 6B is a representative model for calculating port voltages of chip-level placed circuits 125 and input voltages of VTI circuits 110 from chip-level power distribution network 120 of FIG. 6A. In FIG. 6B, VTI circuits 110 of FIG. 6A, are represented by VTI current sources 110A and chip-level placed circuits 125 are represented by chip-level current sources 125A. Using (a) the external power supply voltage, VDDx, (b) the chip-level power distribution network model 120B, (c) the VTI circuit currents, $IVTI_1$ through $IVTI_m$, calculated in the manner described above in reference to FIG. 5B and (d) the modeled current requirements, $IC_1$ through $IC_j$, of chip-level placed circuits 125A, chip-level placed circuit port voltages, $VC_{IN1}$ through $VC_{INj}$, and VTI circuit input voltages, $VVTI_{IN1}$ through $VVTI_{INm}$, can be obtained using conventional linear simulation techniques. Although each voltage island 105A illustrated in FIG. 6B is denoted as having an identical number of VTI circuits 110A, different voltage islands 105A may have different quantities of VTI circuits 110A.

Figure 7:
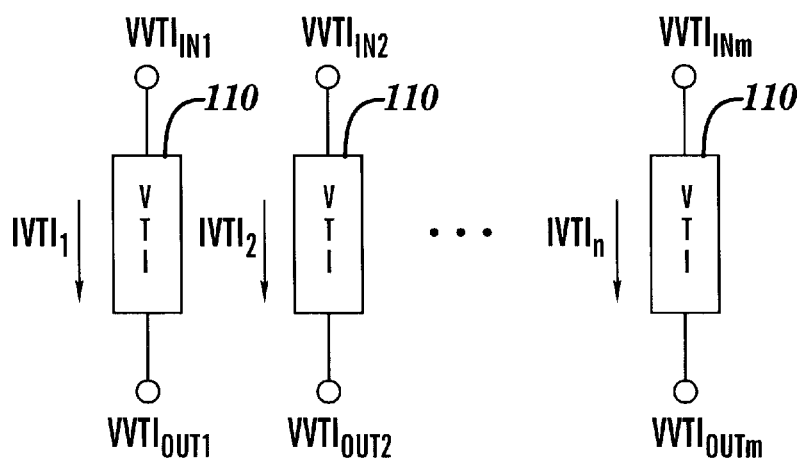
FIG. 7 illustrates the calculation of VTI output voltages, according to the present invention.

FIG. 7 illustrates the calculation of VTI output voltages, according to the present invention. Recall that voltage values $VVTI_{OUT1}$ through $VVTI_{OUTm}$ were initially set to $VDDx_{IDEAL}$=VDDx for the first iteration. This approximation permits a preliminary estimation of the VTI circuit current requirements, and is used solely as an aid to the initial analysis of each voltage-island power distribution network. More accurate values for $VVTI_{OUT1}$ through $VVTI_{OUTm}$ are now calculated as follows: Using (a) the VTI circuit input voltages, $VVTI_{IN1}$ through $VVTI_{INm}$, calculated as described above, and in reference to FIG. 6B, (b) the VTI circuit current requirements, $IVTI_1$ through $IVTI_m$, calculated as described above, and in reference to FIG. 5B and (c) the modeled current-voltage (I–V) characteristic for each VTI circuit, values for the VTI circuit output voltages, $VVTI_{OUT1}$ through $VVTI_{OUTm}$, can be obtained using expression evaluation, table lookup or other techniques. The exact method for "inferring" each output voltage from the corresponding current and input voltage values depends only on the manner in which the I–V characteristic is modeled and represented for use by this method.

Figure 8:
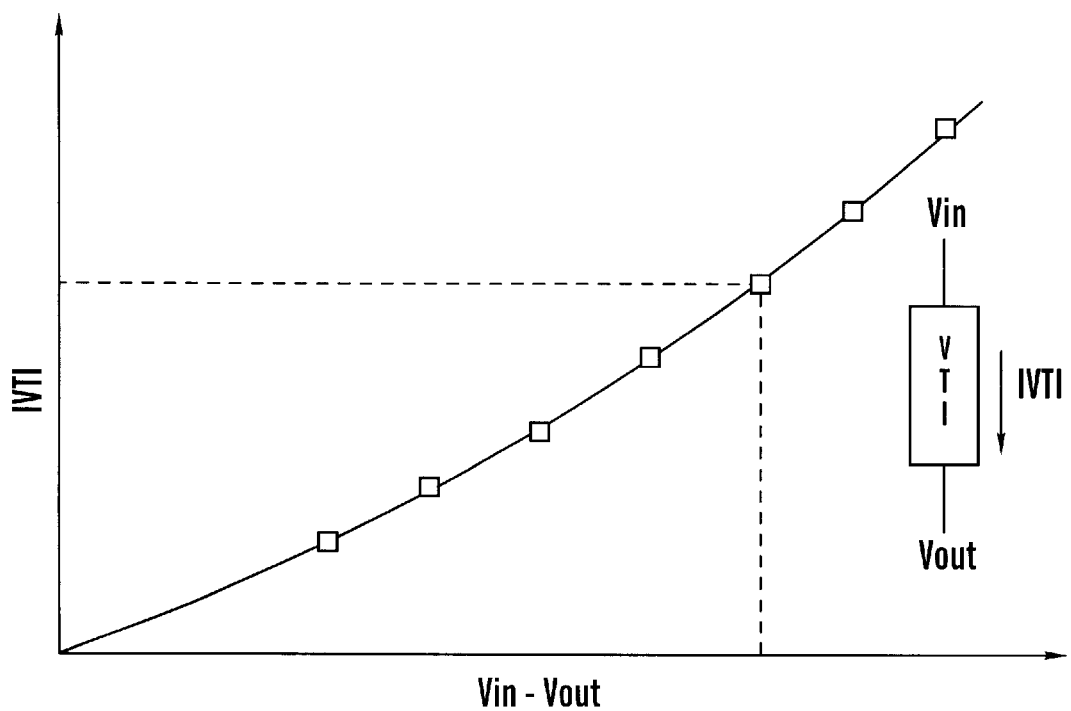
FIG. 8 illustrates the current-voltage (I–V) characteristic of a typical VTI circuit.

FIG. 8 illustrates the current-voltage (I–V) characteristic of a typical VTI circuit. In FIG. 8, $V_{IN}$–$V_{OUT}$ is plotted versus IVTI for a typical VTI circuit 110. When Vin and IVTI are known, Vout can be inferred by direct evaluation of the I–V characteristic. Moreover, the method is valid for both linear and nonlinear circuits. Direct evaluation of the I–V characteristic is repeated for all VTI circuits, and for each voltage island.

The procedures described above in reference to FIGS. 5A, 5B, 6A, 6B, 7, and 8, are sequentially exercised and wholly reiterated until the obtained values for $VC_{IN1}$ through $VC_{INn}$, $VVTI_{IN1}$ through $VVTI_{INm}$, and $VVTI_{OUT1}$ through $VVTI_{OUTm}$ are within a predetermined range when compared to their corresponding values obtained in the prior iteration.

Figure 9A:
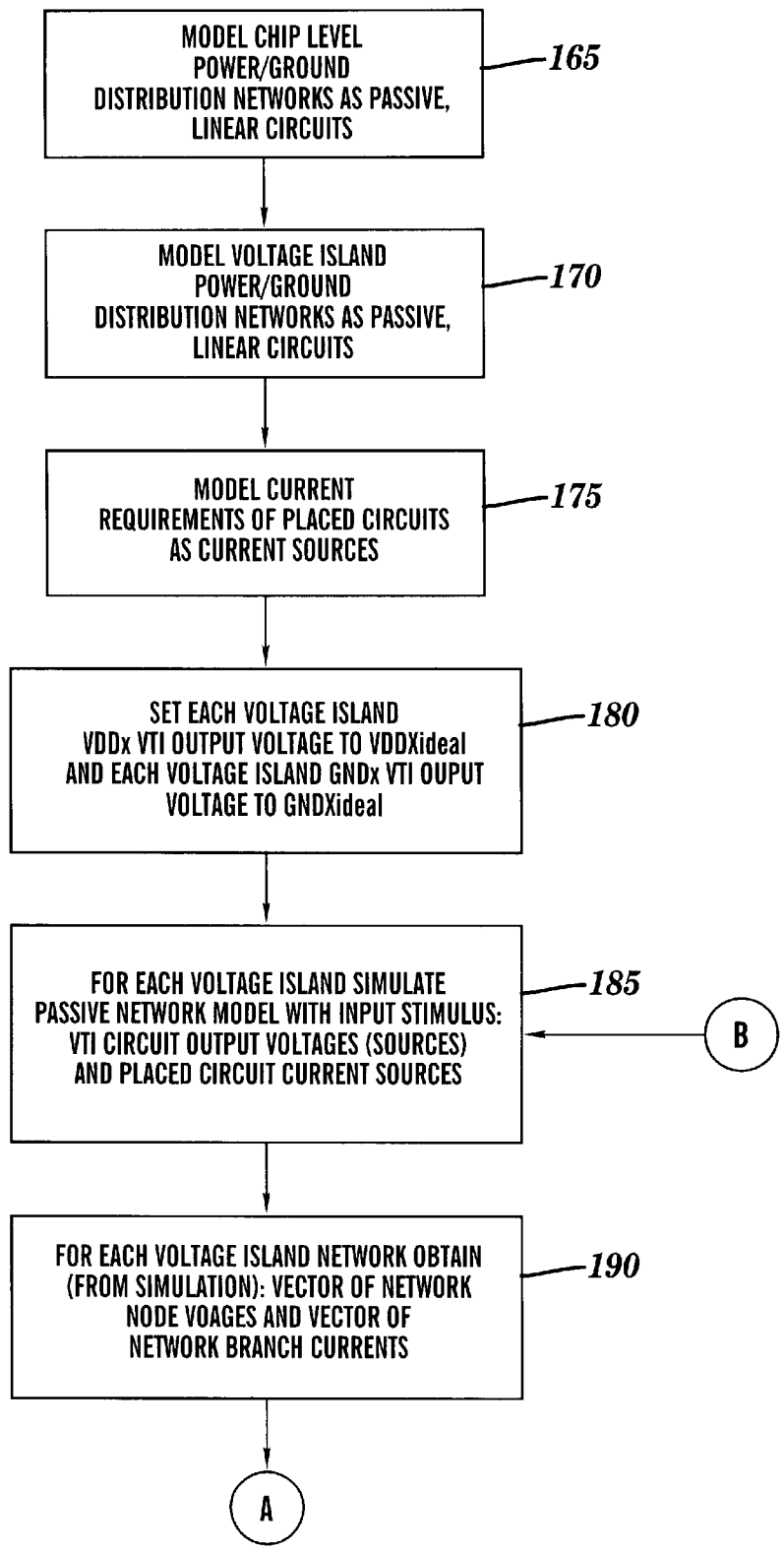
FIGS. 9A and 9B are flowcharts illustrating the method of analyzing integrated circuit power distribution networks in chips containing voltage islands and VTI circuits, according to the present invention.
Figure 9B:
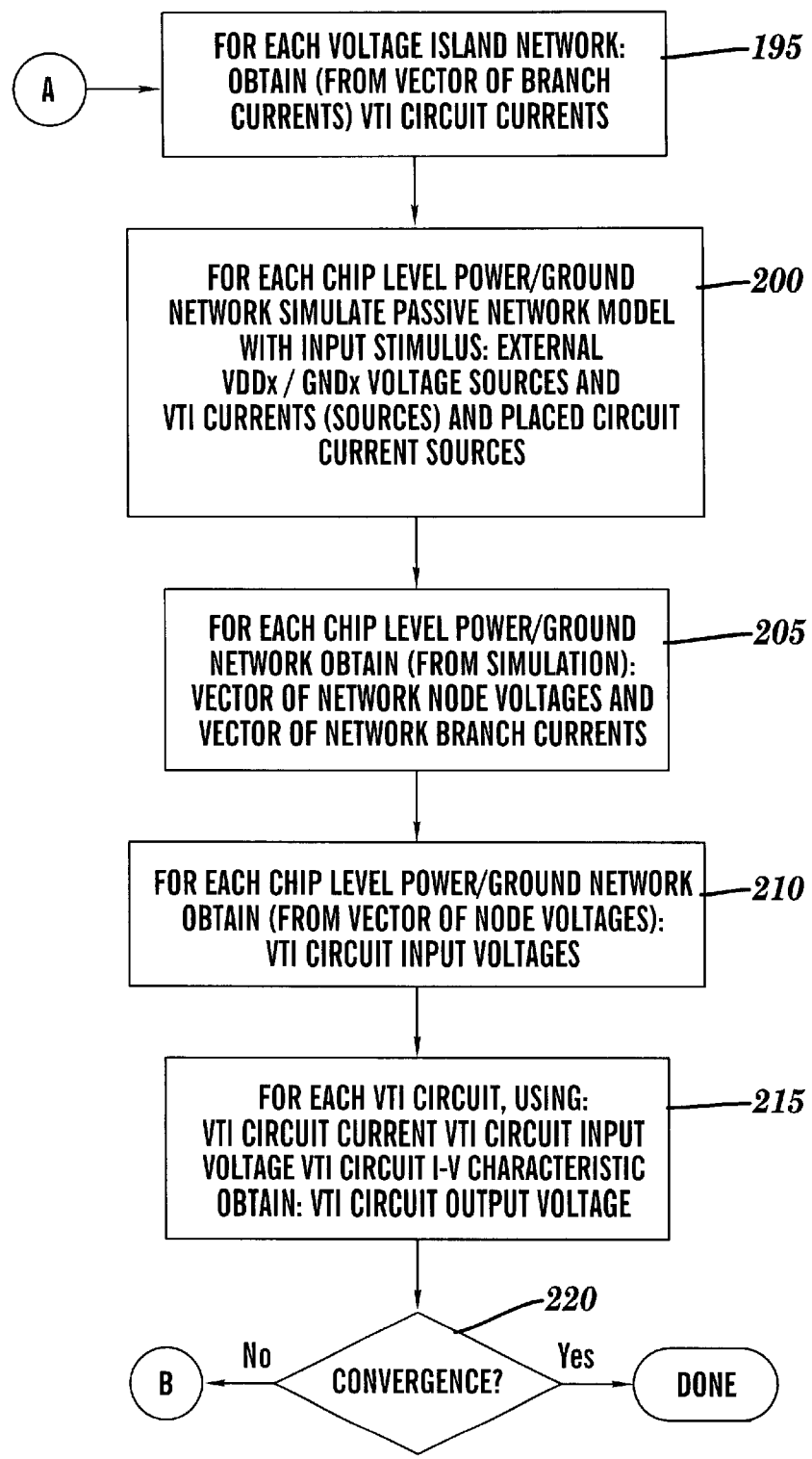

FIGS. 9A and 9B are flowcharts illustrating the method of analyzing integrated circuit power distribution networks in chips containing voltage islands and VTI circuits, according to the present invention. In step 165, chip-level power distribution network(s) 120 and chip-level ground distribution network(s) 140 are modeled as passive linear circuits.

In step 170, the voltage-island power distribution network(s) 130 and the voltage-island ground distribution network(s) 130A are modeled as passive linear circuits.

In step 175, the current requirements of the chip-level placed circuits 125 and voltage-island placed circuits 135 are modeled as current sources.

In step 180, a voltage of $VDDx_{IDEAL}$ is applied to the output ports of all VDDx VTI circuits 110 and a voltage of $GNDx_{IDEAL}$ is applied to the output ports of all GNDx VTI circuits 110A. This establishes the preliminary VTI circuit port voltages for each voltage-island power distribution network 130 (see FIG. 2) and voltage-island ground distribution network 130A (see FIG. 3) and provides the voltage source input stimuli for initial voltage-island simulations.

In step 185, the linear circuit model representing each voltage-island power distribution network 130 and voltage-island ground distribution network 130A is simulated using the preset value (for the first iteration) or most recently computed values (for subsequent iterations) of the VTI circuit output voltages, as well as the current sources representing the corresponding voltage-island placed circuits 135.

In step 190, complete sets of network node voltages and branch currents for each voltage-island power distribution network 130 and voltage-island ground distribution network 130A are obtained from the simulator. The method now proceeds to step 195 of FIG. 9B.

In step 195, for each voltage island 105, the current associated with each VTI circuit 110 is obtained from the vector of measured branch current values obtained in step 190.

In step 200, the linear circuit model representing chip-level power distribution network 120 is excited using the present values of VTI circuit currents and the current sources representing the chip-level placed circuits.

In step 205, complete sets of network node voltages and branch currents for the chip-level power distribution network(s) 120 and chip-level ground distribution network(s) and 140 are obtained from the simulator.

In step 210, the port node voltage values corresponding to the VTI circuit inputs are extracted from the simulation results obtained in step 200.

In step 215, the VTI circuit currents obtained in step 195, the VTI circuit input voltages obtained in step 210, and the VTI circuit current-voltage (I–V) characteristics are used to determine the output voltage value for each VTI circuit.

In step 220, the most recently determined values for the placed-circuit port voltages and all VTI circuit input and output voltages are compared to their corresponding values obtained in the previous iteration (this step is necessarily omitted in the initial iteration, where step 185 is exercised immediately after step 215). If the calculated node voltages deviate significantly (i.e., by more than a predetermined limit) from their previously-derived values, the analysis method is repeated, beginning at step 185 of FIG. 9A, otherwise, the loop is terminated and the network node voltages and branch currents obtained in steps 190 and 200 represent a complete solution to the VDDx/GNDx power distribution, including the networks which comprise voltage islands 105.

It is worth noting that the computational bottlenecks sometimes associated with iterative analysis techniques are not characteristic of the present invention.

For practical applications, the solution time of the present invention is dominated by simulation steps 185 and 200 of FIGS. 9A and 9B, but only for the first iteration. Since the present invention models the passive circuit elements of the VDDx and GNDx networks identically from step to step and, since only the current and voltage source values are modified, once-exercised factorization techniques can be exploited to permit extremely efficient linear system solution times for subsequent iterations.

Figure 10:
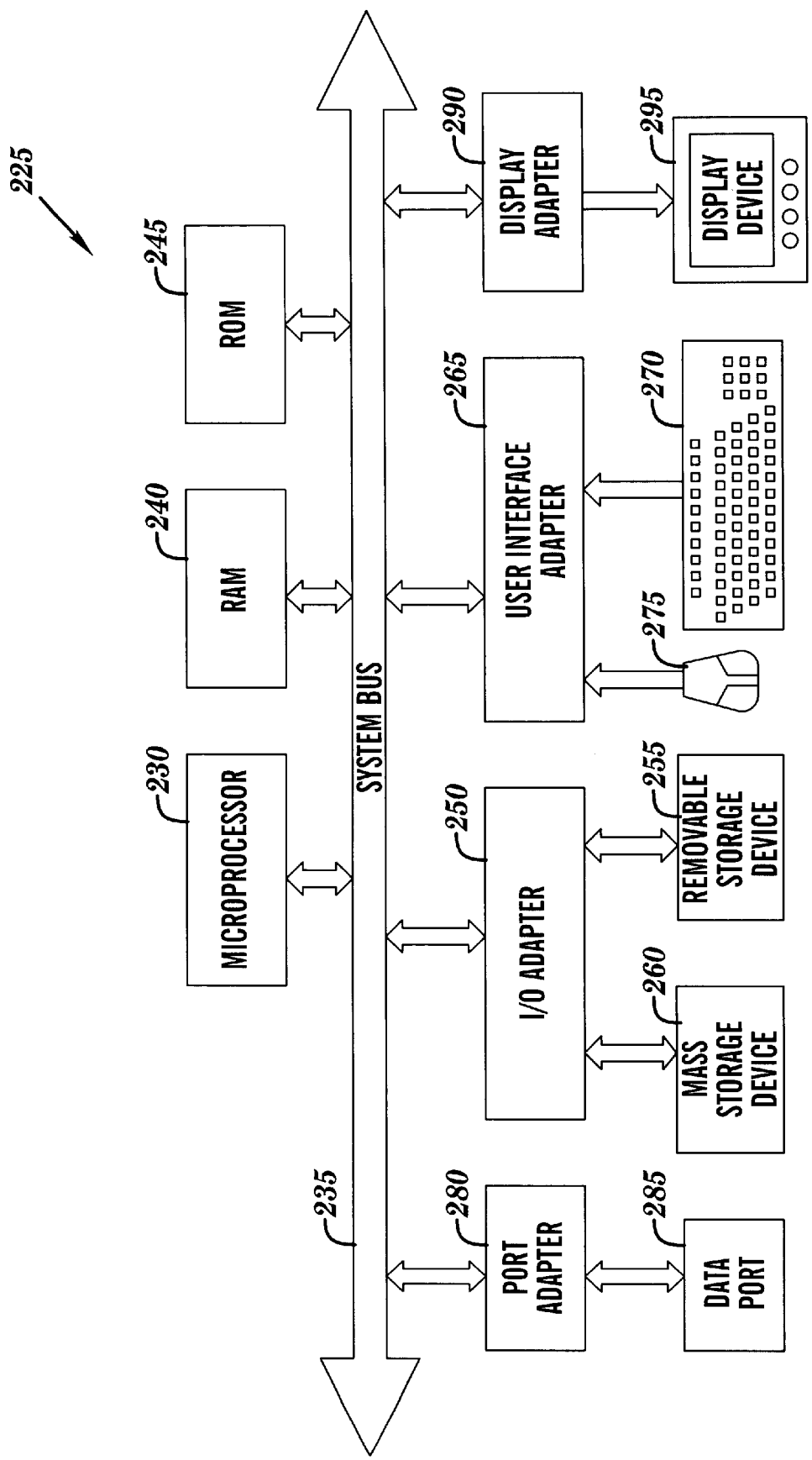
FIG. 10 is a schematic block diagram of a general-purpose computer for practicing the present invention.

Generally, the method described herein with respect to analyzing integrated circuit power distribution in chips containing voltage islands is practiced with a general-purpose computer and the method may be coded as a set of instructions on removable or hard media for use by the general-purpose computer. FIG. 10 is a schematic block diagram of a general-purpose computer for practicing the present invention. In FIG. 10, computer system 225 has at least one microprocessor or central processing unit (CPU) 230. CPU 230 is interconnected via a system bus 235 to a random access memory (RAM) 240, a read-only memory (ROM) 245, an input/output (I/O) adapter 250 for a connecting a removable data and/or program storage device 255 and a mass data and/or program storage device 260, a user interface adapter 265 for connecting a keyboard 270 and a mouse 275, a port adapter 280 for connecting a data port 285 and a display adapter 290 for connecting a display device 295.

ROM 245 contains the basic operating system for computer system 225. The operating system may alternatively reside in RAM 240 or elsewhere as is known in the art. Examples of removable data and/or program storage device 255 include magnetic media such as floppy drives and tape drives and optical media such as CD ROM drives. Examples of mass data and/or program storage device 250 include hard disk drives and non-volatile memory such as flash memory. In addition to keyboard 270 and mouse 275, other user input devices such as trackballs, writing tablets, pressure pads, microphones, light pens and position-sensing screen displays may be connected to user interface 265. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 255, fed through data port 285 or typed in using keyboard 270.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method of analyzing power distribution in a chip containing one or more voltage islands, each voltage island having a power distribution network connected to a chip-level power distribution network by one or more voltage translation interface circuits comprising:

analyzing said voltage-island power distribution networks independently of said chip-level power distribution network to obtain voltage translation interface circuit currents;

using said voltage translation interface circuit currents as input to a model of said chip-level power distribution network to obtain voltage translation interface circuit input voltages; and calculating voltage translation interface circuit output voltages based on said voltage translation interface circuit input voltages, said voltage translation interface circuit currents, and current-voltage characteristics of said voltage translation interface circuits.

2. The method of claim 1, wherein said models of said chip-level power distribution network and said voltage-island power distribution network are each selected from the group consisting of passive and linear circuit models.

3. The method of claim 1, wherein said voltage translation interface circuits have linear or nonlinear current-voltage characteristics.

4. The method of claim 1, wherein said model of said chip-level power distribution network and said voltage island power distribution network are each selected from the group consisting of resistive models and resistive-inductive-capacitive models.

5. A method of analyzing power distribution in a chip containing one or more voltage islands, each voltage island having a power distribution network connected to a chip-level power distribution network by one or more voltage translation interface circuits comprising:

(a) creating a chip-level power distribution network model connected to chip-level placed circuits modeled as current sources;

(b) independently creating a voltage-island power distribution network model connected between voltage translation interface circuit outputs and voltage-island placed circuits modeled as current sources;

(c) obtaining voltage translation interface circuit currents by:
   (i) in a first iteration, using the ideal value of an external voltage source voltage as the values of the voltage translation interface circuit output voltages;
   (ii) in subsequent iterations using the most recently computed values for the voltage translation interface circuit output voltages; and
   (iii) simulating the voltage-island power distribution network model with its corresponding voltage-island placed circuits modeled as current sources and the most recently obtained values for its voltage translation interface circuit output voltages applied as voltage sources;

(d) exciting the chip-level power distribution network model with the most recently obtained values of the voltage translation interface circuit currents;

(e) obtaining, through simulation of the chip-level power distribution network model, values for the voltage translation interface circuit input voltages and values for the chip-level placed circuit port voltages;

(f) calculating updated values for the voltage translation interface circuit output voltages, based on the most recently obtained values for the voltage translation interface circuit input voltages, the currents through the voltage translation interface circuits, and the current-voltage characteristics of said voltage translation interface circuits; and (g) comparing the updated values to immediately previous values for the chip-level placed circuit port voltages, voltage translation interface circuit input voltages, and voltage translation circuit output voltages, and, if not converged to within a preset limit, repeating steps (c) through (g).

6. The method of claim 5, wherein said models of said chip-level power distribution network and said voltage-island power distribution network are each selected from the group consisting of passive and linear circuit models.

7. The method of claim 5, wherein said voltage translation interface circuits have linear or nonlinear current-voltage characteristics.

8. The method of claim 5, wherein said model of said chip-level power distribution network and said voltage island power distribution network are each selected from the group consisting of resistive models and resistive-inductive-capacitive models.

9. A program storage device readable by machine, tangibly embodying a program of instructions executable by the machine to perform method steps for analyzing power distribution in a chip containing one or more voltage islands, each voltage island having a power distribution network connected to a chip-level power distribution network by one or more voltage translation interface circuits, said method steps comprising:
   (a) creating a chip-level power distribution network model connected to chip-level placed circuits modeled as current sources;
   (b) independently creating a voltage-island power distribution network model connected between voltage translation interface circuit outputs and voltage-island placed circuits modeled as current sources;
   (c) obtaining voltage translation interface circuit currents by:
      (i) in a first iteration, using the ideal value of an external voltage source voltage as the values of the voltage translation interface circuit output voltages;
      (ii) in subsequent iterations using the most recently computed values for the voltage translation interface circuit output voltages; and
      (iii) simulating the voltage-island power distribution network model with its corresponding voltage-island placed circuits modeled as current sources and the most recently obtained values for its voltage translation interface circuit output voltages applied as voltage sources;
   (d) exciting the chip-level power distribution network model with the most recently obtained values of the voltage translation interface circuit currents; (e) obtaining, through simulation of the chip-level power distribution network model, values for the voltage translation interface circuit input voltages and values for the chip-level placed circuit port voltages;
   (f) calculating updated values for the voltage translation interface circuit output voltages, based on the most recently obtained values for the voltage translation interface circuit input voltages, the currents through the voltage translation interface circuits, and the current-voltage characteristics of said voltage translation interface circuits; and
   (g) comparing the updated values to immediately previous values for the chip-level placed circuit port voltages, voltage translation interface circuit input voltages, and voltage translation circuit output voltages, and, if not converged to within a preset limit, repeating steps (c) through (g).

10. The program storage device of claim 11, wherein said models of said chip-level power distribution network and said voltage-island power distribution network are each selected from the group consisting of passive and linear circuit models.

11. The program storage device of claim 11, wherein said voltage translation interface circuits have linear or nonlinear current-voltage characteristics.

12. The program storage device of claim 11, wherein said model of said chip-level power distribution network and said voltage island power distribution network are each selected from the group consisting of resistive models and resistive-inductive-capacitive models.

13. A computer system comprising a processor, an address/data bus coupled to said processor, and a computer-readable memory unit coupled to communicate with said processor, said memory unit containing instructions that when executed implement a method for analyzing power distribution in a chip containing one or more voltage islands, each voltage island having a power distribution network connected to a chip-level power distribution network by one or more voltage translation interface circuits, said method comprising the computer implemented steps of:
   (a) creating a chip-level power distribution network model connected to chip-level placed circuits modeled as current sources;
   (b) independently creating a voltage-island power distribution network model connected between voltage translation interface circuit outputs and voltage-island placed circuits modeled as current sources;
   (c) obtaining voltage translation interface circuit currents by:
      (i) in a first iteration, using the ideal value of an external voltage source voltage as the values of the voltage translation interface circuit output voltages;
      (ii) in subsequent iterations using the most recently computed values for the voltage translation interface circuit output voltages; and (iii) simulating the voltage-island power distribution network model with its corresponding voltage-island placed circuits modeled as current sources and the most recently obtained values for its voltage translation interface circuit output voltages applied as voltage sources;

(d) exciting the chip-level power distribution network model with the most recently obtained values of the voltage translation interface circuit currents;

(e) obtaining, through simulation of the chip-level power distribution network model, values for the voltage translation interface circuit input voltages and values for the chip-level placed circuit port voltages;

(f) calculating updated values for the voltage translation interface circuit output voltages, based on the most recently obtained values for the voltage translation interface circuit input voltages, the currents through the voltage translation interface circuits, and the current-voltage characteristics of said voltage translation interface circuits; and (g) comparing the updated values to immediately previous values for the chip-level placed circuit port voltages, voltage translation interface circuit input voltages, and voltage translation circuit output voltages, and, if not converged to within a preset limit, repeating steps (c) through (g).

14. The computer system of claim 13, wherein said models of said chip-level power distribution network and said voltage-island power distribution network are each selected from the group consisting of passive and linear circuit models.

15. The computer system of claim 13, wherein said voltage translation interface circuits have linear or nonlinear current-voltage characteristics.

16. The computer system of claim 13, wherein said model of said chip-level power distribution network and said voltage island power distribution network are each selected from the group consisting of resistive models and resistive-inductive-capacitive models.

\* \* \* \* \*